(12) United States Patent
König et al.

(10) Patent No.: US 8,884,277 B2
(45) Date of Patent: Nov. 11, 2014

(54) THICK FILM CONDUCTIVE COMPOSITION AND USE THEREOF

(71) Applicant: Heraeus Precious Metals GmbH & Co. KG, Hanau (DE)

(72) Inventors: Markus König, Dieburg (DE); Michael Neidert, Obertshausen (DE); Matthias Hörtheis, Hanau (DE); Carsten Mohr, Gross-Umstadt (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 0 days.

(21) Appl. No.: 13/672,463

(22) Filed: Nov. 8, 2012

(65) Prior Publication Data

US 2013/0130435 A1    May 23, 2013

Related U.S. Application Data

(60) Provisional application No. 61/585,088, filed on Jan. 10, 2012.

(30) Foreign Application Priority Data

Nov. 9, 2011  (EP) ..................... 11008907

(51) Int. Cl.
| | | |
|---|---|---|
| *H01L 29/08* | (2006.01) | |
| *H01B 1/22* | (2006.01) | |
| *C03C 8/04* | (2006.01) | |
| *H01L 31/18* | (2006.01) | |
| *C03C 8/18* | (2006.01) | |
| *H01L 23/00* | (2006.01) | |

(52) U.S. Cl.
CPC ...... *H01L 31/18* (2013.01); *H01B 1/22* (2013.01); *C03C 8/04* (2013.01); *C03C 8/18* (2013.01); *H01L 24/03* (2013.01)
USPC .............................................. 257/40; 438/99

(58) Field of Classification Search
USPC .......... 438/98, 612, 82, 99; 257/40, 626, 783, 257/E23.155, E23.018
See application file for complete search history.

(56) References Cited

U.S. PATENT DOCUMENTS

| | | | |
|---|---|---|---|
| 6,174,462 B1 | 1/2001 | Oka et al. | |
| 6,328,914 B1 * | 12/2001 | Lautzenhiser et al. | ......... 252/510 |
| 2003/0124461 A1 * | 7/2003 | Suess et al. | ................. 430/281.1 |
| 2005/0037278 A1 * | 2/2005 | Koishikawa et al. | ...... 430/270.1 |
| 2009/0294741 A1 | 12/2009 | Yang et al. | |
| 2012/0305859 A1 * | 12/2012 | Hang et al. | ..................... 252/514 |

FOREIGN PATENT DOCUMENTS

| | | | |
|---|---|---|---|
| EP | 1 713 093 B1 | | 9/2008 |
| JP | 2005-317432 | * | 11/2005 |
| JP | 2010-251645 | * | 11/2010 |
| KR | 2010 0061331 A | | 6/2010 |
| WO | 2011/066300 A1 | | 6/2011 |

* cited by examiner

*Primary Examiner* — Jarrett Stark
*Assistant Examiner* — Shahed Ahmed
(74) *Attorney, Agent, or Firm* — Blank Rome LLP

(57) ABSTRACT

The invention relates to a thick film conductive composition comprising metal particles wherein the specific surface area of the silver particles measured by BET according to ISO 9277 is equal to or more than 1.8 m²/g; manganese oxide; glass particles; and an organic vehicle.

23 Claims, No Drawings

THICK FILM CONDUCTIVE COMPOSITION AND USE THEREOF

CROSS-REFERENCE TO RELATED APPLICATIONS

This application claims priority to U.S. Provisional Application No. 61/585,088 filed Jan. 10, 2012, and EP 11 008 907.5 filed Nov. 9, 2011, the disclosures of which are incorporated herein by reference in their entirety.

FIELD OF THE INVENTION

This invention is directed to a thick film conductive composition. In particular, it is directed to a thick film conductive composition for use in a solar cell device. The invention further refers to the use of the thick film conductive composition in a process for forming an electrode on a dielectric layer of a silicon wafer.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

Solar cells are devices that convert the sun's energy into electricity using the photovoltaic effect. Solar power is an attractive energy source because it is sustainable and non-polluting. Accordingly, a great deal of research is currently being devoted to developing solar cells with enhanced efficiency while maintaining low material and manufacturing costs.

Most common solar cells are those based on silicon, more particularly, a p-n junction made from silicon by applying a n-type diffusion on a p-type silicon substrate, coupled with two electrical contact layers or electrodes. In order to minimize reflection of the sunlight by the solar cell, an antireflection coating, such as silicon nitride, is applied to the n-type diffusion layer. Using a silver paste, for example, a grid-like metal contact may be screen printed onto the antireflection layer to serve as a front electrode. This electrical contact layer on the face or front of the cell, where light enters, is typically present in a grid pattern made of "finger lines" and "bus bars". Finally, a rear contact is applied to the substrate, such as by applying a backside silver or silver/aluminum paste followed by an aluminum paste to the entire backside of the substrate. The device is then fired at a high temperature to convert the metal pastes to metal electrodes. A description of a typical solar cell and the fabrication method thereof may be found, for example, in European Patent Application Publication No. 1 713 093.

For improving efficiency solar cells have been developed not only comprising antireflective dielectric front side layer but also a dielectric layer on their backside. By electrical passivation of the surface of a solar cell recombination of charge carriers is reduced, which has a positive effect on the efficiency of a solar cell. Most effective solar cells may be produced if formation of recombination centers is avoided during metallization, i.e. applying a selective emitter, reducing the metalized area and contacting the solar cell only along the contact fingers. The passivated area e.g. under the busbars and/or solder pads is not affected by the metallization.

After applying a metal containing composition, firing of the layered substrate the solar cells are interconnected to modules by soldering of solder ribbons.

In WO 2011/066300 A1 a so-called PERC (passivated emitter and rear contact) silicon solar cell and a process for preparing the cell is described. The backside electrode is produced by applying and drying a silver paste pattern on a perforated dielectric passivation layer on the backside of a silicon wafer. The silver covers only a part of the wafer's back surface, i.e. bare areas are left onto which an aluminum paste for formation of an aluminum back electrode is applied. The silver paste is not especially defined but shall have a "poor" fire-through capability and comprises particulate silver and an organic vehicle. Typical thick film conductive compositions have high metal powder contents, i.e. silver powder contents, of about 80 wt. % or even more.

BRIEF SUMMARY OF THE INVENTION

In view of the above prior art there thus exists the necessity to provide metal pastes having a low metal content which are useful for the production of solar cells with high efficiencies.

Thus, the present invention relates to a thick film conductive composition comprising:
(a) electrically conductive metal, wherein the specific surface area of the metal particles measured by BET according to ISO 9277 is equal to or more than 1.8 m$^2$/g,
(b) manganese oxide;
(c) glass frit; and
(d) an organic vehicle.

According to a second embodiment the present invention relates to the use of a thick film conductive composition comprising
(a) electrically conductive metal, wherein the specific surface area of the metal particles measured by BET according to ISO 9277 is equal to or more than 1.8 m$^2$/g,
(b) manganese oxide;
(c) glass frit; and
(d) an organic vehicle
for forming an electrode on a passivated layer of a silicon wafer.

According to a third embodiment the present invention relates to the use of a thick film conductive composition comprising
(a) electrically conductive metal, wherein the specific surface area of the metal particles measured by BET according to ISO 9277 is equal to or more than 1.8 m$^2$/g,
(b) manganese oxide;
(c) glass frit; and
(d) an organic vehicle
for forming an electrode on the back side of a silicon wafer.

DETAILED DESCRIPTION

The thick film conductive composition according to the invention comprises four essential components: metal particles having a specific surface area, glass frit, manganese oxide, and an organic vehicle. The thick film composition may comprise further additives including metals, metal oxides or any compounds that can generate these metals or metal oxides during firing. The components are discussed herein below.

All surface areas mentioned in this description refer to surface areas measured by BET according to according to DIN ISO 9277, 2003-05.

Metal Particles

The electrically conductive metal is selected from the group consisting of Cu, Ag, Pd, Zn, Ni, Sn, Al, Bi, alloys of Cu, Ag, Zn, Ni, Sn, Al, Bi, Pd and mixtures thereof. The electrically conductive metal can be in a flake form, a spherical form, a granular form, a crystalline form, a powder, or other irregular forms and mixtures thereof. The electrically conductive metal can be provided in a colloidal suspension.

Preferably, the electrically conductive metal is selected from Ag, Cu, Zn, Sn. Especially preferred is Ag as the electrically conductive metal. It can be in the form of silver metal, silver derivatives, or mixtures thereof. Exemplary derivatives include: alloys of silver, silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), for example. Other forms of silver compatible with the other thick-film paste components can also be used.

In one embodiment, the electrically conductive metal or derivatives thereof is from about 10 to about 75 wt. % of the solid components of the thick-film composition. In a further embodiment, the electrically conductive metal or derivatives thereof is from about 30 to about 70 wt. % of the solid components of the thick-film composition.

In an embodiment, the solids portion of the thick-film composition includes about 10 to about 75 wt. % metal particles.

The specific surface area of the metal particles is equal to or more than 1.8 $m^2/g$, preferably in the range of 2.0 to 3.0 $m^2/g$.

The particle size of the metal is typically in the range from 0.1 to 10 μm, and preferably in the range from 0.3 to 8 μm.

Unless otherwise indicated herein, all particle sizes or average particle sizes stated herein are D50 particle diameters measured by laser diffraction. As well understood by those in the art, the D50 diameter represents the size at which half of the individual particles (by weight) are smaller than the specified diameter. Such diameters provide the metal with suitable sintering behavior and spreading of the thick film conductive composition on the antireflection layer when forming a solar cell.

Glass Frit

The glass frit (glass particles) functions as an inorganic binder in the electroconductive paste composition and acts as a flux material to deposit the metal onto the substrate during firing. The specific type of glass is not critical provided that it shall not penetrate the dielectric layer and give good adhesion. Preferred glasses include lead borosilicate and bismuth borosilicate, but other lead-free glasses, such as zinc borosilicate, would also be appropriate.

The glass particles preferably have a particle size of about 0.1 to about 10 μm, more preferably less than about 5 μm, and are preferably contained in the composition in an amount of 0.5 to 10 wt. %, more preferably from 0.5 wt. % to 5 wt. % based on the total weight of the paste composition.

The glass frit may be a lead-containing glass frit, e.g. containing 53 to 57 wt. % of PbO, 23 to 29 wt. % of $SiO_2$, 5 to 11 wt. % of ZnO, 6 to 9 wt. % of $B_2O_3$, and minor amounts of CaO, MgO, and $Na_2O$. Preferred are lead-containing glass frits having a softening temperature in the range from 410 to 480, more preferably from 420 to 460° C.

The glass frit may also be a lead-free glass frit containing $Bi_2O_3$ as the major component. Typical lead-free glass frits comprise 50 to 85 wt.-%, preferably 65 to 80 wt.-% of $Bi_2O_3$, 0.5 to 10 wt.-% of $SiO_2$, >0 to 7 wt.-%, in particular 2 to 6 wt.-% of $Al_2O_3$, 3 to 10 wt.-% of ZnO, 2 to 10 wt.-% of $B_2O$, and >0 to 3 wt.-% of MgO, for example, and have a softening temperature in the range from 400 to 550° C.

Manganese Oxide

The inventive thick film conductive composition comprises manganese oxide. The oxide may be any manganese oxide or any compound which upon firing converts into manganese oxide. Mn(II)O is preferred. Preferably, the amount of manganese oxide is in the range of 0.2 to 5 wt. %, preferably from 0.2 to 3 wt. % based on the total weight of the paste. The particle size of the preferred Mn(II)O is preferably equal to or less than 200 nm, more preferably equal to or less than 100 nm.

Organic Vehicle

The particular organic vehicle or binder is not critical and may be one known in the art. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The organic vehicle is preferably present in the composition in an amount of 25 to 70 wt.-%, more preferably from 30-60 wt.-% based on the total weight of the composition.

The inorganic components are typically mixed with an organic medium by mechanical mixing to form viscous compositions called "pastes", having suitable consistency and rheology for printing. A wide variety of inert viscous materials can be used as organic medium. The organic medium must be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties.

Additives

Additional metal/metal oxide additives may be present in the thick film composition of the present invention and may be selected from (a) a metal wherein said metal is selected from Zn, Al, Ti, Sn, Pb, Ru, Co, Fe, Cu and Cr, (b) a metal oxide, wherein the metal is selected from Zn, Ti, Sn, Pb, Ru, Co, Fe, Cu and Cr, (c) any compounds that can generate the metal oxides of (b) upon firing, and (d) mixtures thereof.

The particle size of the additional metal/metal oxide additives is not subject to any particular limitation, although an average particle size of no more than 10 μm, and preferably no more than 5 μm, is desirable.

The range of the metal/metal oxide additives including manganese oxide in the composition is typically 0.2 weight % to 5 weight % in the total composition.

It is also within the scope of the invention to include additional additives in the electroconductive paste composition. For example, it may be desirable to include thickener (tackifier), stabilizer, dispersant, viscosity adjuster, etc. compounds, alone or in combination. Such components are well known in the art. The amounts of such components, if included, may be determined by routine experimentation depending on the properties of the electroconductive paste that are desired.

Use/Process

The electroconductive paste composition may be prepared by any method for preparing a paste composition known in the art or to be developed; the method of preparation is not critical. Alternatively, the fine metal particles may be suspended in a liquid medium, such as diethylene glycol or butyl carbitol acetate. The paste components may then be mixed, such as with a mixer, then passed through a three roll mill, for example, to make a dispersed uniform paste. It is within the scope of the invention to include the additive in powder form or suspended in a liquid medium.

It has been found that utilization of the inventive thick film conductive paste composition is especially useful for a metallization applied onto a dielectric passivation layer of a solar cell. It has been found that such a metallization does not attack the dielectric layer of a solar cell while adheres well to the passivation and thus gives rise to a long durability or service life of the silicon solar cells.

Thus, the present invention further refers to the use of the thick film conductive paste composition for forming a soldering pad or bus bars on a passivated or dielectric layer of a semiconductor substrate, e.g., a silicon wafer.

The thick film conductive paste composition is especially useful for forming the bus bars on the front of a silicon solar cell or soldering pads on the backside of a passivated emitter and rear contact solar cell.

According to another aspect the present invention refers to a process for the production of a solar cell, comprising (I) providing a semiconductor substrate comprising at least one dielectric layer deposited onto a surface of the semiconductor substrate;

(II) applying a thick-film composition onto at least a portion of the dielectric layer to form a layered structure, wherein the thick-film composition comprises:

(a) electrically conductive metal, wherein the specific surface area of the metal particles measured by BET according to ISO 9277 is equal to or more than 1.8 m$^2$/g, (b) manganese oxide;

(c) glass frit; and (d) an organic vehicle, and (III) firing the layered structure, forming an soldering element in contact with the dielectric layer of the semiconductor substrate.

In detail the production of a solar cell having a dielectric layer on at least one surface of a semiconductor device comprises several steps.

In a first step of a process for formation of the metallization of a front-side bus bar of a solar cell an antireflective or dielectric layer is provided on a semiconductor device. Typically, the semiconductor device is a mono- or polycrystalline silicon wafer as is conventionally used for the production of silicon solar cells. It has a p-type region, an n-type region and a p-n junction.

The passivated or dielectric coating layer on the front side may be made, for example, of $SiN_x$, $SiO_x$, $Al_xO_y$, $TiO_x$, $HfO_x$, or combinations thereof, such as a dielectric stack of $Al_xO_y$/$SiO_x$/$SiN_x$, $AlxOy$/$SiN_x$ or, $SiO_x$/$SiN_x$ $SiO_x$/$SiO_x$. Deposition of the dielectric layer may be performed, for example, using a process such as plasma CVD (chemical vapor deposition) in the presence of hydrogen or sputtering, ALD (atomic layer deposition), thermally grown ($SiO_x$). Typically the dielectric layers have a thickness in the range of atomic monolayer to 200 nm.

In a second step the front side electrode of the wafer is applied as so called fingers by screen printing and drying front-side with a commercially available thick film conductive composition (front electrode forming thick film conductive composition, preferably silver paste) on the antireflective coating layer on the frontside of the cell. The frontside bus bars made of the inventive thick film composition are subsequently screen printed forming a so-called H pattern which comprises thin parallel finger lines (collector lines) and two or more busbars intersecting the finger lines at right angle. The busbars are featuring two or more continuous lines or separated pads overlapping and contacting the fingers. The busbar forms upon firing an electrical contact to the fingers. Upon firing, the commercially available thick-film composition forming the so-called fingers provides electric contact to the semiconductor device, while the thick film composition of the present invention forming the bus bars does not provide any or nearly no electric contact to the semiconductor device.

The conductive thick-film composition of the present invention, however, also can be used for the formation of soldering pads on a dielectric layer on the back side of a so-called PERC solar cell.

In a process for producing a solar cell with the inventive thick film composition used for the production of soldering pads on the back side of a semiconductor device not only a dielectric layer is applied to the front side, but also to the back side of the semiconductor device according to a process already described above.

The thick film composition according to the present invention for forming the soldering pads may be applied first to the dielectric layer, e.g. by screen printing, and thereafter an aluminum paste is applied in the bare areas with slight overlap over the conductive thick film composition of the present invention.

However, it is also possible to apply the aluminum paste first to the dielectric layer and later apply the thick film composition for forming the soldering pads.

In both cases firing is then typically carried out in a belt furnace with the wafer reaching a peak temperature in the range of 700 to 900° C. for a period of 1 to 5 seconds, while the total firing process takes between 0.75 and 2 min. The front electrode and the back electrodes can be fired sequentially or cofired.

Local contacts between silicon wafer and aluminum paste are provided e.g. by laser fired contacts (LFC) after firing the aluminum paste. However, the electrical contacts also may be provided by applying a locally structured dielectric layer in advance of aluminum printing. The local contacts are then formed during a contact firing step.

The wafer is fired at a temperature above the melting point of aluminum to form an aluminum-silicon melt at the local contacts between the aluminum and the silicon, i.e. at those parts of the silicon wafer's back-surface not covered by the dielectric passivation layer.

Upon firing the thick film composition of the invention does not form a direct contact to the silicon, i.e. the dielectric passivation layer on the back side of the silicon wafer will not or will not significantly be damaged during firing.

The invention will now be described in conjunction with the following, non-limiting examples.

EXAMPLES

Thick film compositions were prepared according to standard procedures. To an organic vehicle (terpineol solution containing ethyl cellulose) the appropriate amounts of Ag powder, glass fit, and metal oxides as indicated in Table I were added. This mixture was premixed by a universal mixer and kneaded by a 3-roll mill, so that a silver electroconductive paste was obtained.

The silver-powder used in the examples and comparative example 2 had an average particle size D50 of 2.4 µm and a specific surface area measured by BET according to ISO 9277 of 2.3 m$^2$/g. The silver-powder used in comparative example 1 had an average particle size d50 of 2.3 µm and a specific surface area measured by BET according to ISO 9277 of 1.1 m$^2$/g.

The glass frit used in the examples has a composition after ICP-OES (inductively coupled plasma optical emission spectrometry) of 54.8 mol-% PbO, 26.0 mol-% SiO$_2$%, 9.5 mol-% ZnO, 7.2 mol-% B$_2$O$_3$, 0.7 mol-% Al$_2$O$_3$, 0.2 mol-% CaO, 0.3 mol-% MgO, and 1.3 mol-% Na$_2$O.

Monocrystallline (cz) p-type silicon wafers of 156 mm$^2$ having a thickness of 180 µm were manufactured using screen printing processes. The silicon wafers comprised an n-type diffused POCl$_3$ emitter (70 Ω/square sheet resistance) and a 70 nm thick silicon nitride anti-reflection coating deposited by plasma-enhanced chemical vapor deposition (PE-CVD) on the front side. Onto the full area of the backside of the silicon wafer an aluminum paste (CypoSol S55-10, available by BASF AG, Ludwigshafen) was screen printed. The front side metallization was printed using different sample pastes as indicated in Table 1 and H-grid screens with fingers and bus bars. Every H-grid comprises 75 fingers with finger opening of 80 µm and 3 bus bars of a width of 1.5 mm. The dried film thicknesses were in the range of 20-25 µm.

The coated silicon wafers were dried in a box furnace at 150° C. for 10 min and fired in a rapid thermal firing furnace with the set temperature of 850° C. for completion of the metallization process. The belt speed was 5600 mm/s.

The busbars of the fired samples were soldered to fluxed solder ribbon (ribbon: Sn62PB36Ag2, flux Kester Soldering Flux 961-E) with a soldering machine (Somont GmbH, Germany, 260° C. soldering temperature, 1.5 s contact time, 175° C. hot plate temperature). After soldering the bus bars were cut out with a diamond disc saw and glued onto alumina substrates using double-sided tape.

According to one embodiment of the invention, the surface area of the metal particles and in particular of the Ag particles is determined by BET according to ISO 9277.

According to another embodiment of the invention, the surface area of the metal particles and in particular of the Ag particles is determined by BET according to the following test method: BET measurements to determine the specific surface area of silver particles are made in accordance with DIN ISO 9277:1995. A Gemini 2360 (from Micromeritics) which works according to the SMART method (Sorption Method with Adaptive dosing Rate), is used for the measurement. As reference material Alpha Aluminum oxide CRM BAM-PM-102 available from BAM (Bundesanstalt für Materialforschung und-prüfung) is used. Filler rods are added to the reference and sample cuvettes in order to reduce the dead volume. The cuvettes are mounted on the BET apparatus. The saturation vapor pressure of nitrogen gas (N2 5.0) is determined. A sample is weighed into a glass cuvette in such an amount that the cuvette with the filler rods is completely filled and a minimum of dead volume is created. The sample is kept at 80° C. for 2 hours in order to dry it. After cooling the weight of the sample is recorded. The glass cuvette containing the sample is mounted on the measuring apparatus. To degas the sample, it is evacuated at a pumping speed selected so that no material is sucked into the pump. The mass of the sample after degassing is used for the calculation. The dead volume is determined using Helium gas (He 4.6). The glass cuvettes are cooled to 77 K using a liquid nitrogen bath. For the adsorptive, N2 5.0 with a molecular cross-sectional area of 0.162 nm2 at 77 K is used for the calculation. A multi-point analysis with 5 measuring points is performed and the resulting specific surface area given in m2/g.

The solar cells were tested using an I-V tester (h.a.l.m. elektronik GmbH, Germany). The Xe arc lamp in the I-V tester irradiated the front surface of the solar cells using simulated sunlight with a known intensity to generate the I-V curve. Using this data, efficiency and pseudo fill factor (pFF) were determined.

The mechanical adhesion of the ribbon soldered to the bus bars was tested with a GP Stable-Test Pro (GP Solar GmbH, Germany) under an angle of 45°.

For each sample the data of 5 solar cell samples were measured and the averaged results are presented in Table 1.

TABLE 1

Comparison of Ag compositions

|  | Comparative example 1 | Comparative example 2 | Example |
|---|---|---|---|
| Ag powder 1 | 69.43 wt.-% |  |  |
| Ag powder 2 |  | 69.43 wt.-% | 69.43 wt.-% |
| Glass frit 1 | 2.74 wt.-% | 2.74 wt.-% | 2.74 wt.-% |
| ZnO | 1.62 wt.-% | 0.62 wt.-% | 0.62 wt.-% |
| MnO |  |  | 1.00 wt.-% |
| Organic vehicle | 26.21 wt.-% | 26.21 wt.-% | 26.21 wt.-% |
| efficiency | 16.7% | 5.0% | 4.3% |
| pFF | 83.4% | 83.3% | 83.0% |
| F$_{max}$ | 3.7N | 1.4N | 4.2N |

The efficiencies are a valuable indication for the contacting behavior of the pastes on the front sides of the solar cells, meaning the quality of the electrical connection between the conductive metals and the silicon wafers. High values, as required for regular front side of solar cells, can only be achieved when the passivating SiN$_x$ dielectric layer is penetrated and an electrical contact between finger and silicon is created during the firing process. In turn, low efficiencies can be obtained when the passivation layer remains intact after firing.

To prove whether or not the passivation was sustained, the pseudo fill factor (pFF) was observed. The pFF parameter is defined as the maximum obtainable fill factor for the solar cell by people familiar to the art. It indicates the presence of electrically active defects induced during the metallization process or the integrity of the passivation layer in turn. Electrical defects created by incorporation of impurities from the metallization paste into the silicon material of the wafer during the firing process would lower the pFF significantly. Hence, the high and stable pFF values together with low efficiencies of the fired solar cells show that the passivating function remained stable and, thus, the coating was not affected by the front side metallization. Not only the efficiencies were lowered significantly, but also the adhesion could be increased to a remarkable extent by the new thick film compositions.

What is claimed:
1. A thick film conductive composition comprising:
   (a) metal particles, wherein the specific surface area of the metal particles measured by BET according to ISO 9277 is equal to or greater than 1.8 m$^2$/g;
   (b) manganese oxide;
   (c) glass particles; and
   (d) an organic vehicle.

2. The thick film composition of claim 1, wherein the manganese oxide is 0.2 to 5 wt.-% based on the total composition.

3. The thick film composition of claim 1, wherein the manganese oxide is Mn(II)O.

4. The thick film composition of claim 2, wherein the metal particles are 10-75 wt.-% based on the total composition, the glass particles are 0.5-10 wt.-% based on the total composition, and the organic vehicle is 25-70 wt.-% based on the total composition.

5. The thick film composition of claim 1, wherein the metal particles comprise silver.

6. A method of forming soldering pads, comprising the steps of:
(a) applying a dielectric layer to a semiconductor substrate; and
(b) applying a thick film conductive composition according to claim 1 on the dielectric layer to form soldering pads.

7. The method according to claim 6, wherein the manganese oxide is 0.2 to 5 wt.-% based on the total composition.

8. The method according to claim 6, wherein the manganese oxide is Mn(II)O.

9. The method according to claim 7, wherein the metal particles are 10-75 wt.-% based on the total composition, the glass particles are 0.5-10 wt.-% based on the total composition, and the organic vehicle is 25-70 wt.-% based on the total composition.

10. The method according to claim 6, wherein the metal particles comprise silver.

11. The method according to claim 6, comprising the step of forming the soldering pads on the backside of the semiconductor substrate.

12. A method of forming soldering bus bars, comprising the steps of:
(a) applying a dielectric layer to a semiconductor substrate; and
(b) applying a thick film conductive composition according to claim 1 on the dielectric layer to form bus bars.

13. The method according to claim 12, wherein the manganese oxide is 0.2 to 5 wt.-% based on the total composition.

14. The method according to claim 12, wherein the manganese oxide is Mn(II)O.

15. The method according to claim 13, wherein the metal particles are 10-75 wt.-% based on the total composition, the glass particles are 0.5-10 wt.-% based on the total composition, and the organic vehicle is 25-70 wt.-% based on the total composition.

16. The method according to claim 12, wherein the metal particles comprise silver.

17. The method according to claim 12, comprising the step of forming the soldering bus bars on the front side of the semiconductor substrate.

18. A method of making a solar cell, comprising the steps of:
(a) providing a semiconductor substrate comprising at least one dielectric layer deposited onto a surface of the semiconductor substrate;
(b) applying a thick-film composition according to claim 1 onto at least a portion of the dielectric layer to form a layered structure;
(c) firing the layered structure to form a soldering element in contact with the dielectric layer of the semiconductor substrate.

19. The method according to claim 18, comprising the steps of:
(a) first applying the dielectric layer to a front side of the semiconductor substrate; and
(b) next applying the thick-film composition to the front side of the semiconductor substrate to form bus bars.

20. The method according to claim 18, comprising the steps of:
(a) first applying the dielectric layer to a backside of the semiconductor substrate; and
(b) next applying the thick-film composition to the backside of the semiconductor substrate to form soldering pads.

21. The thick film composition of claim 1, wherein the particle size of the manganese oxide is equal to or less than 200 nm.

22. The thick film composition of claim 1, wherein the metal particles are 10-70 wt.-% based on the total composition.

23. The thick film composition of claim 1, wherein the specific surface area of the metal particles measured by BET according to ISO 9277 is 2.0 to 3.0 $m^2/g$.

* * * * *

UNITED STATES PATENT AND TRADEMARK OFFICE
CERTIFICATE OF CORRECTION

| | | |
|---|---|---|
| PATENT NO. | : 8,884,277 B2 | Page 1 of 1 |
| APPLICATION NO. | : 13/672463 | |
| DATED | : November 11, 2014 | |
| INVENTOR(S) | : Markus König et al. | |

It is certified that error appears in the above-identified patent and that said Letters Patent is hereby corrected as shown below:

On the Title Page, correct the spelling of the inventor's name as follows:

Replace "Matthias HÖRTHEIS" with -- Matthias HÖRTEIS --

Signed and Sealed this
Tenth Day of March, 2015

Michelle K. Lee
*Deputy Director of the United States Patent and Trademark Office*